United States Patent [19]

Graf, III

[11] Patent Number: 5,912,573
[45] Date of Patent: *Jun. 15, 1999

[54] SYNCHRONIZING CLOCK PULSE GENERATOR FOR LOGIC DERIVED CLOCK SIGNALS FOR A PROGRAMMABLE DEVICE

[75] Inventor: W. Alfred Graf, III, Saratoga, Calif.

[73] Assignee: Cypress Semiconductor Corp., San Jose, Calif.

[*] Notice: This patent is subject to a terminal disclaimer.

[21] Appl. No.: 08/828,325

[22] Filed: Mar. 28, 1997

[51] Int. Cl.⁶ .................................................. H03K 5/13
[52] U.S. Cl. ............................................ 327/145; 327/291
[58] Field of Search .................................. 327/141, 144, 327/145, 291, 299; 395/881, 551; 326/93

[56] References Cited

U.S. PATENT DOCUMENTS

4,871,930  10/1989  Wong et al. ........................... 307/465
4,973,860  11/1990  Ludwig ................................... 327/145
5,471,159  11/1995  Stuebing et al. ......................... 327/24
5,760,609   6/1998  Sharpe-Geisler ........................ 327/291

Primary Examiner—Timothy P. Callahan
Assistant Examiner—Eunja Shin
Attorney, Agent, or Firm—Blakely Sokoloff Taylor Zafman LLP

[57] ABSTRACT

A programmable device includes means for generating an asynchronous logic derived clock signal from one or more of a number of input signals. Means for synchronizing the asynchronous logic derived clock signal to a reference clock signal are coupled to the means for generating. The means for synchronizing generate a synchronized logic derived clock signal from the asynchronous logic derived clock signal and the reference clock signal. The synchronized logic derived clock signal has a fixed duration logic HIGH interval for variable duration logic HIGH intervals of the input logic signals from which the synchronized logic derived clock signal is created.

16 Claims, 7 Drawing Sheets

Asynchronous Clock Logic Array

SYNCHRONIZING CLOCK PULSE GENERATOR FOR LOGIC DERIVED CLOCK SIGNALS FOR A PROGRAMMABLE DEVICE

RELATED APPLICATIONS

This application is related to the following co-pending applications, each assigned to the Assignee of the present invention:

Application Ser. No. 08/827,271, filed Mar. 28, 1997, entitled "Fast Clock Generator and Clock Synchronizer for Logic Derived Clock Signals for a Programmable Device".

Application Ser. No. 08/828,434, filed Mar. 28, 1997, entitled "Fast Clock Generator and Clock Synchronizer for Logic Derived Clock Signals with Synchronous Clock Suspension Capability for a Programmable Device".

Application Ser. No. 08/825,359, filed Mar. 28, 1997, entitled "Synchronizing Clock Pulse Generator for Logic Derived Clock Signals with Synchronous Clock Suspension Capability for a Programmable Device".

Application Ser. No. 08/825,484, filed Mar. 28, 1997, entitled "Pulse Discriminating Clock Synchronizer for Logic Derived Clock Signals for a Programmable Device".

Application Ser. No. 08/828,319, filed Mar. 28, 1997, entitled "Pulse Discriminating Clock Synchronizer for Logic Derived Clock Signals with Synchronous Clock Suspension Capability for a Programmable Device".

Application Ser. No. 08/825,482, filed Mar. 28, 1997, entitled "Asynchronous Pulse Discriminating Synchronizing Clock Pulse Generator for Logic Derived Clock Signals for a Programmable Device".

Application Ser. No. 08/825,489, filed Mar. 28, 1997, entitled "Asynchronous Pulse Discriminating Synchronizing Clock Pulse Generator for Logic Derived Clock Signals with Synchronous Clock Suspension Logic for a Programmable Device".

FIELD OF THE INVENTION

The present invention relates to programmable logic devices and, more particularly, to capturing data in a register in response to synchronized logic derived clock signals in a programmable device.

BACKGROUND

Programmable logic devices (PLDs) are popular general purpose logic devices. PLDs generally include an AND array, an OR array and an input/output (I/O) macrocell. A routing interconnect is used to transport signals to various elements within the device. The AND array typically includes a plurality of logical AND gates and generates a large number of output signals called AND or product terms. The AND terms are received by the OR array which generally includes a plurality of OR gates. The OR array generates a number of output signals, called sum terms, by ORing selected AND terms together. The sum terms generated by the OR array are then received by the I/O macrocell which comprises a number of circuit elements including D-type data registers. The I/O macrocell of most PLDs outputs signals from the PLD and also feeds output signals back into the AND array for further use.

Many families of programmable logic devices such as PLDs, complex PLDs (so-called CPLDs), field programmable gate arrays (FPGAs) and application specific integrated circuits (ASICs) are synchronously clocked devices. That is, these families of devices have dedicated pins which receive a system clock signal for use within the programmable logic device. For example, some conventional synchronous programmable logic devices receive clock input signals from dedicated clock/input pins and route such signals to programmable registers within one or more I/O macrocells.

Other families of PLDs can accommodate asynchronous clocking wherein the clock signals which are used to capture data in registers contained in these devices are created by logically combining a number of logic inputs and/or internally generated logic signals to create the clock signal. In these devices, a particular signal generated, for example, by the AND or OR arrays can be utilized, in place of a dedicated system clock, to capture a signal in one of the register elements in an I/O macrocell. This function is termed asynchronous clocking because a signal other than a dedicated system clock is utilized by one or more register elements. Where the asynchronous clock signal is generated by the AND array, the asynchronous clock signal may be referred to as a product term clock signal. Where the asynchronous clock signal is generated by the OR array, it may be referred to as a sum term or a sum of products term if the asynchronous clock signal is generated by a combination of signals provided by the AND and OR arrays.

In architectures where an asynchronous signal is used by one or more register elements in an I/O macrocell as a clock signal, these logically derived clocks signals are restricted to very low frequencies of operation because the asynchronous signals usually must traverse the large general purpose logic array of the CPLD or FPGA. As a result, an input change in the incoming signal(s) from which the logic derived clock signal is created must wait for any preceeding transitions to transit the slow logic array signal path before the subsequent input transitions can be processed. This restriction limits the frequency at which these devices can operate to frequencies much lower than those possible for synchronous operation in which external clock signals are applied directly to a register clock input via fast, dedicated clock signal paths.

In addition, the input signals from which the logic derived clock signal is created can arrive at unpredictable times at the programmable device. The unpredictable signal arrival time may result in a violation in the setup or hold time relative to the data signal to be captured in the register. The difference between logic derived clock signal and data signal transit times through the programmable device can be considerable. Therefore, to ensure that this potential mismatch in signal timing does not cause a violation of the data signal setup time or hold time relative to the logic derived clock signal input to the register, operation must be derated to allow for the worst case difference or skew between the data signal and the logic derived clock signals which can be anticipated in a given CPLD or FPGA due to variations in internal logic placement and routing.

Figure 1:
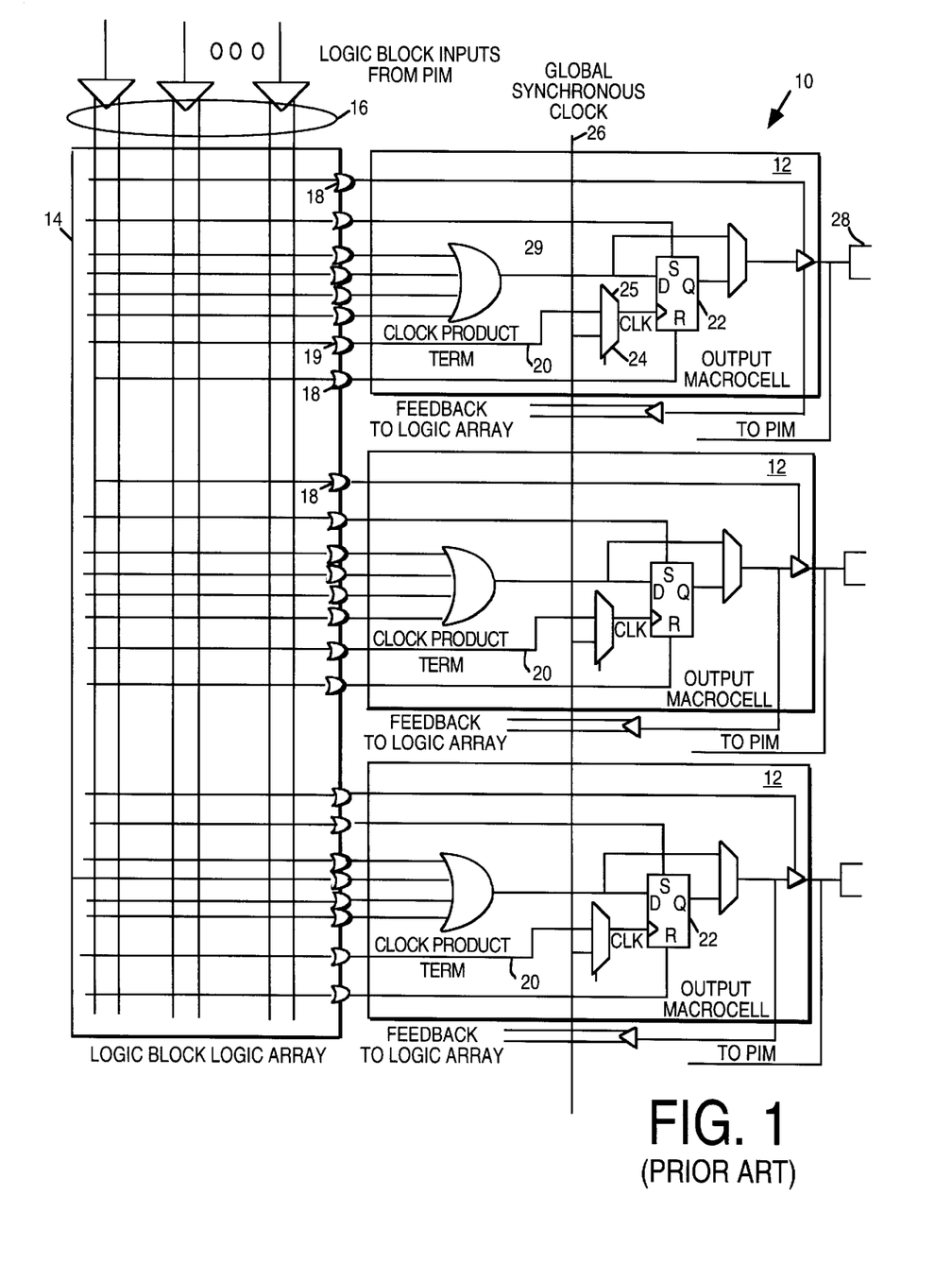
FIG. 1 illustrates the use of product term or asynchronous logic derived clock signals in macrocells of a conventional programmable device.

FIG. 1 shows an example of product terms used to create logic derived clock signals in macrocells of a CPLD which are part of a larger logic array of one of the logic blocks of a CPLD. CPLD 10 includes macrocells 12 and logic block logic array 14. Logic block logic array 14 receives a number of signals 16 from a programmable interconnect matrix (PIM) within CPLD 10. The PIM (not shown) acts as a user programmable routing matrix for signals within the device. Signals 16 from the PIM are passed to logic block logic array 14 for routing to one or more macrocells 12. Note that, in general, signals 16 from the PIM include the logic complement of each signal. Thus, for "n" signals, 2n signal lines are present in logic block logic array 14. Likewise, each of the logic gates 18 in logic block logic array will have 2n input lines. For clarity, however, only one input line for each logic gate 18 is shown and this shorthand form of notation is typically employed and understood by those skilled in the art and is used in this application to illustrate exemplary embodiments of the present invention.

One or more of the signals 16 provided to logic block logic array 14 may be combined using dedicated logic gates 19 to produce a product term clock signal 20. Product term clock signal 20 may be used as a logic derived clock signal by a register 22 within one of the macrocells 12. In general, register 22 captures data signals presented on line 29 in response to a rising (or falling) edge of a clock signal (CLK) on clock line 25. Using a multiplexer 24 within macrocell 12, a user can select between product term clock signal 20 or a synchronous clock signal 26 as the means by which data signals can be captured in register 22. Data signals which are captured in register 22 may ultimately be provided to an output pad 28 and/or routed back through logic block logic array 14 or the PIM to form more complex signal combinations.

The product term clock signal 20 shown in FIG. 1 may be responsive to one or more external input signals which can arrive at CPLD 10 at any time from an external system. There is significant risk that these external signals will produce changes at the clock signal input of register 22 which will violate required setup and hold times relative to the data signal supplied on line 29 for capture by register 22. Such an occurrence can cause the wrong data state to be captured by register 22. Also, when setup and hold times are violated there is significant probability that a metastable event can occur which will cause an undesired logic state to be output by register 22 until the metastable event has been resolved. Even though the correct output logic state may eventually be obtained, the time required for recovery from the metastable condition can be much longer than the usual clock input to valid data output delay. Normally, additional margins must be added to the logic derived clock signal period to allow for the resolution of such metastable states. This requirement adds even more delay to the logic derived clock period, lowering the frequency of operation even further.

Also as shown in FIG. 1, if a "sum" expression is required to generate the product term clock signal 20, it must be created in another macrocell 12 and fed back to the input of the clock product term 19. This added pass through logic block logic array 14 reduces even further the possible frequency of operation of the product term clock signal 20.

Figure 2:
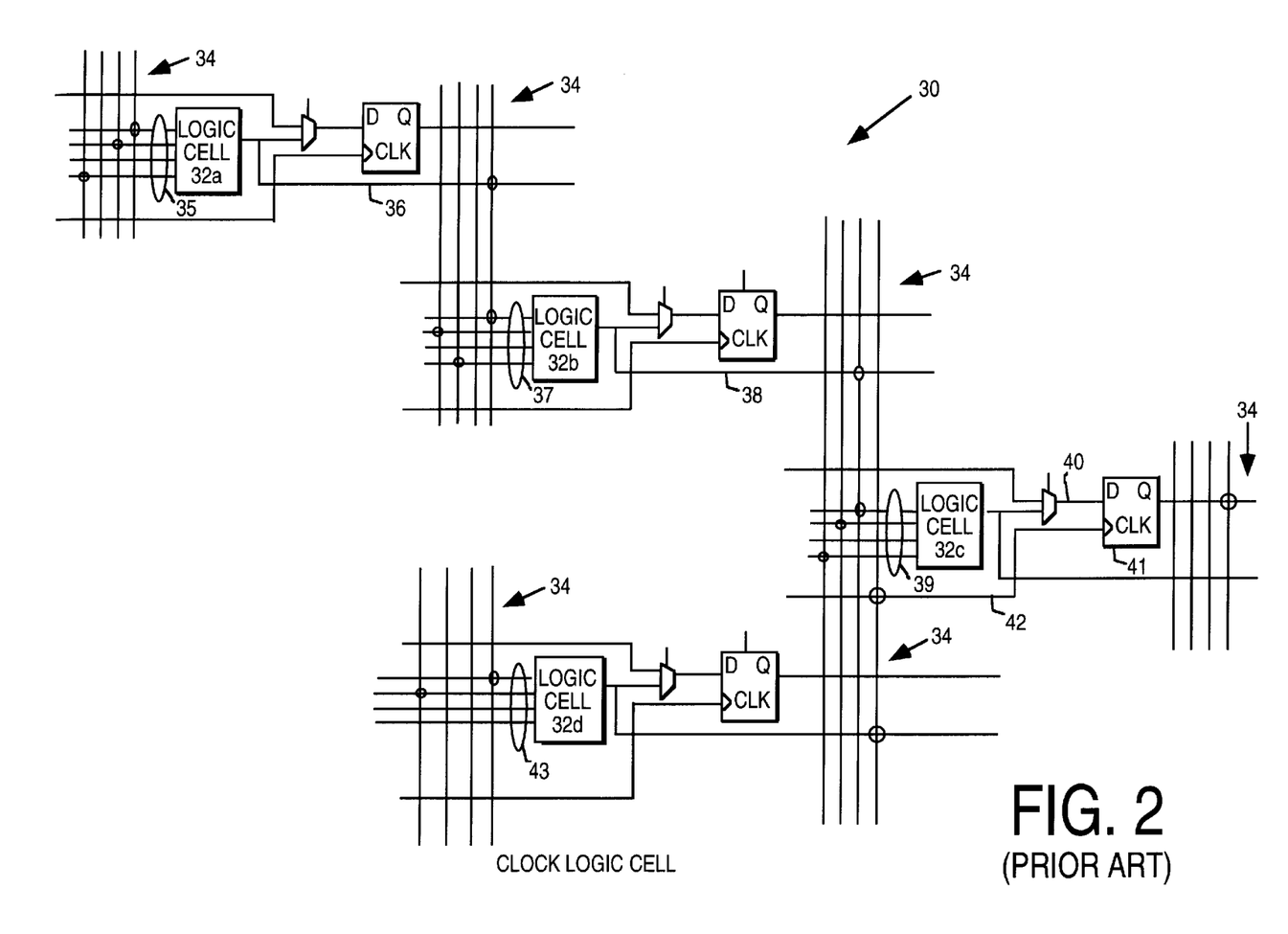
FIG. 2 illustrates the generation of logic derived clock signals in logic cells of a conventional FPGA.

FIG. 2 shows the generation of logic derived clock signals in the logic cells of an FPGA by routing an output of one logic cell to the clock input of a register which receives data from an output of another logic cell. An input signal change which produces a change in the logic derived clock signal can be several logic blocks prior to the clock input of the controlled register.

FPGA 30 may include several logic cells 32a–32d. Logic cell 32a may receive and operate on one or more signals provided from a PIM 34. As illustrated, logic cell 32a receives three input signals 35. The circled interconnections of the inputs 35 within PIM 34 represent programmable elements (e.g., fuses, antifuses, flash cells, RAM cell controlled pass transistors, etc.) which have been programmed so as to route the respective signals to logic cell 32a.

Logic cell 32a may perform one or more operations on the input signals 35 and provide an output signal 36 to PIM 34. This output signal 36 may be one of several input signals 37 to logic cell 32b which performs other operations and produces output signal 38 to PIM 34. Finally, signal 38 may be one of several inputs 39 to logic cell 32c which performs further logical operations and provides data signal 40 to register 41.

Register 41 captures data signal 40 on the rising edge of a logic derived clock signal 42 which is itself received from PIM 34. Logic derived clock signal 42 is produced by logic cell 32d from a number of input signals 43. These input signals 43 may themselves be routed through PIM 34 from other logic cells prior to reaching logic cell 32d. If any of the input signals 43 which are used to create the logic derived clock signal 42 are derived from external asynchronous input signals whose transitions cannot be reliably predicted, no timing precautions will guarantee proper observance of relative data and clock signal timing requirements at the register 48 input.

It should be noted that the transit times for data signals and clock signals are strongly affected by the relative internal locations of the signal sources since FPGAs typically exhibit a wide distribution of internal interconnect delays. Consequently, the relative signal timing of the logic derived clock signal and the data signal is difficult to predict and designs which rely on logic derived clock signals cannot be guaranteed to function reliably. As a result of this timing unpredictability, some FPGAs provide a clock enable which can be used to wait for all the transit delays to occur before enabling the clock signal path to the logic cell register. This approach still requires a delay to be observed to accommodate the worst case possible delay in the clock signal path and the data signal must be held at the data input of the register to allow for this worst case delayed clock enable. This scheme results in very slow performance with logic derived clock signals.

Any logic derived clock signal (e.g., product term clock signal 20 in FIG. 1 or signal 42 in FIG. 2) whose arrival at a controlled register (e.g., register 22 in FIG. 1 or register 41 in FIG. 2) can result in the violation of setup or hold timing relative to the data signal input (e.g., signal 29 in FIG. 1 or signal 40 in FIG. 2) can generate a metastable register state which will frequently require a time longer than a normal clock signal to valid data output delay time to resolve to a stable output state. In the event that the arrival of a logic derived clock signal cannot be predicted, additional timing margins must be provided in the clock signal path to allow for the metastable recovery time to ensure an acceptably low level of probability of a functional failure due to a metastablity event.

Accordingly, what is desired is a means to provide fast logic generated clock signals for use in CPLDs, FPGAs and other programmable devices to allow higher performance logic derived clock frequencies. It is also desirable to have a means for synchronizing the logic derived clock signals to the data so as to eliminate the risk of register data signal and clock signal timing mismatches and to reduce or eliminate the potential for metastability-induced functional failures. Further, it is desirable that the logic HIGH interval of the synchronized logic derived clock signal be of fixed duration for variable duration logic HIGH intervals of the input logic signal from which the logic derived clock signal will be created. Such a fixed duration logic HIGH interval of the synchronized logic derived clock signal will provide a predictable clock duty cycle within the programmable device.

SUMMARY OF INVENTION

In one embodiment, the present invention provides a programmable device which includes means for generating an asynchronous logic derived clock signal from one or more of a plurality of input signals. Means for synchronizing the asynchronous logic derived clock signal to a reference clock signal are coupled to the means for generating. The means for synchronizing generate a synchronized logic derived clock signal from the asynchronous logic derived clock signal and the reference clock signal. The synchronized logic derived clock signal has a fixed duration logic HIGH interval for variable duration logic HIGH intervals of the input logic signals from which the synchronized logic derived clock signal is created.

BRIEF DESCRIPTION OF THE DRAWINGS

The features and advantages of the present invention are illustrated by way of example in the accompanying drawings which are in no way intended to limit the scope of the present invention to the particular embodiments shown.

DETAILED DESCRIPTION

Described herein is a programmable device which includes a dedicated, fast asynchronous clock logic array (CLA) which can be responsive to a subset of external input signals (or to all external input signals, if desired) and which provides a logic derived clock signal path to a register. The present invention may thus increase the upper bound on the frequency of operation of logic derived clock signals. Also included in the present invention is an asynchronous clock synchronizer (ACS) which provides a means to synchronize asynchronous, logic derived clock signals to one or more external synchronous clock inputs to the device. The asynchronous, logic derived clock signal may be synchronized to a synchronous clock signal used to capture a data input in an input register. The outputs of the input register may be logically combined with other signals in the programmable device to produce a data signal input into an output register which is responsive to the synchronized logic derived clock signal. Further, the ACS is configured to generate a synchronized asynchronous logic derived clock pulse having a fixed duration logic HIGH interval, regardless of the duration of the logic HIGH interval of the input logic signals from which the logic derived clock signal is produced. Although described with reference to a CPLD architecture, those skilled in the art will recognize that the present invention is equally applicable for use in PLDs, FPGAs, ASICs or other programmable devices. Accordingly, the embodiments described below should be regarded as illustrative only.

Figure 3:
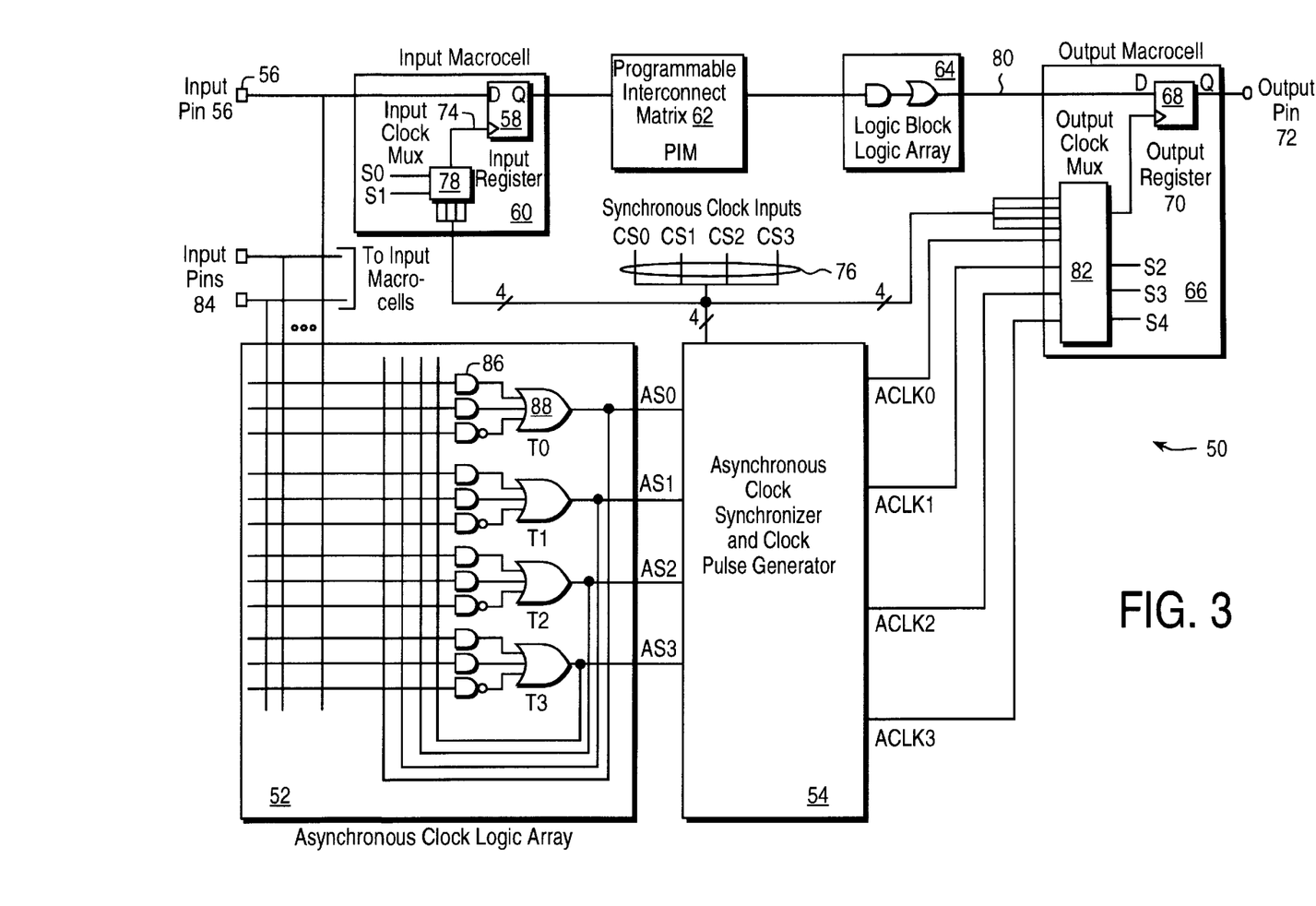
FIG. 3 illustrates a dedicated, asynchronous clock logic array and an associated asynchronous logic derived clock signal synchronizer/clock pulse generator according to one embodiment of the present invention.

FIG. 3 illustrates a programmable device 50 which includes an asynchronous clock logic array (CLA) 52 and an asynchronous logic derived clock signal synchronizer (ACS)/clock pulse generator 54. Data signals provided on an input pin 56 are captured in an input register 58 of an input macrocell 60. Output signals from the input register 58 are routed through a programmable interconnect matrix (PIM) 62 to a logic block logic array 64 which may include logical AND terms and/or logical OR terms. The signals from register 58 are combined with other signals in device 50 in logic block logic array 64 to produce a resulting data signal on line 80 for presentation to output macrocell 66. The data signal so provided is captured in register 68 on the rising edge of a clock signal on output clock line 70, and passed to output pin 72. Alternatively, or in addition, the signal captured by register 68 may be routed back through PIM 62 and/or logic block logic array 64 to be combined with other signals to form more complex signals (these possible signal paths have not been shown in FIG. 3 so as not to overly complicate the drawing). It is important that the clock signal on output clock line 70 be provided to register 68 at a time when the data signal from logic block logic array 64 is valid. Otherwise, invalid data may be latched or a metastable condition may result.

The data signal on input pin 56 may be captured in register 58 on the rising edge of a clock signal provided on input clock line 74. This clock signal is typically an external synchronous clock signal and may be one of several such synchronous clock signals 76 provided to programmable device 50. For the embodiment illustrated in FIG. 3, four synchronous clock signals 76 (CS0–CS3) are provided to programmable device 50. In other embodiments, more or fewer synchronous clock signals 76 may be so provided. Input clock select multiplexer (mux) 78 controls which of the synchronous clock signals 76 are provided to register 58. As will be discussed in further detail below, the synchronous clock signal provided to register 58 on input clock line 74 will be delayed from the respective one of synchronous clock signals 76 by a time associated with a propagation delay through clock select mux 78.

Output register 68 captures a data signal on line 80 provided by logic block array 64. This data signal will be valid at a time dependent upon propagation delays associated with register 58, PIM 62 and logic block logic array 64. The data signal on line 80 may be captured in register 68 on the rising edge of an output clock signal on output clock line 70. The output clock signal may be one of the synchronous clock signals 76 or one of a number of synchronized logic derived clock signals ACLK0–ACLK3 provided to output clock select mux 82. Regardless of which signal is selected as the output clock signal, it is important that the output clock signal be provided to register 68 at a time when the data signal on line 80 is valid, otherwise invalid data will be captured or a metastable state may result.

Synchronized logic derived clock signals ACLK0–ACLK3 are produced by CLA 52 and ACS 54 in response to one or more input signals 84 and external synchronous clock signals 76. Input signals 84 may be one or more logic signals provided to programmable device 50. These input signals 84 are provided directly to CLA 52 without being routed through PIM 62 or logic block logic array 64. Thus, propagation delays which were present in the logic derived clock signals discussed with reference to FIGS. 1 and 2 are avoided. This helps to increase the frequency at which registers (such as register 68) may capture data signals using logic derived clock signals.

Asynchronous clock logic array (CLA) 52 is illustrated as including a number of logic gates 86 and 88. Logic gates 86 may have 2n inputs, where n indicates the number of inputs signals 84 provided to CLA 52. There are 2n inputs to logic gates 86 because each input signal 84 and/or its logic compliment may be logically combined in logic gates 86 to produce intermediate signals. These intermediate signals may be logically combined by one or more logic gates 88 produce one or more asynchronous (product or sum term) logic derived clock signals. The same drawing shorthand used in FIG. 1 is used here.

Figure 4:
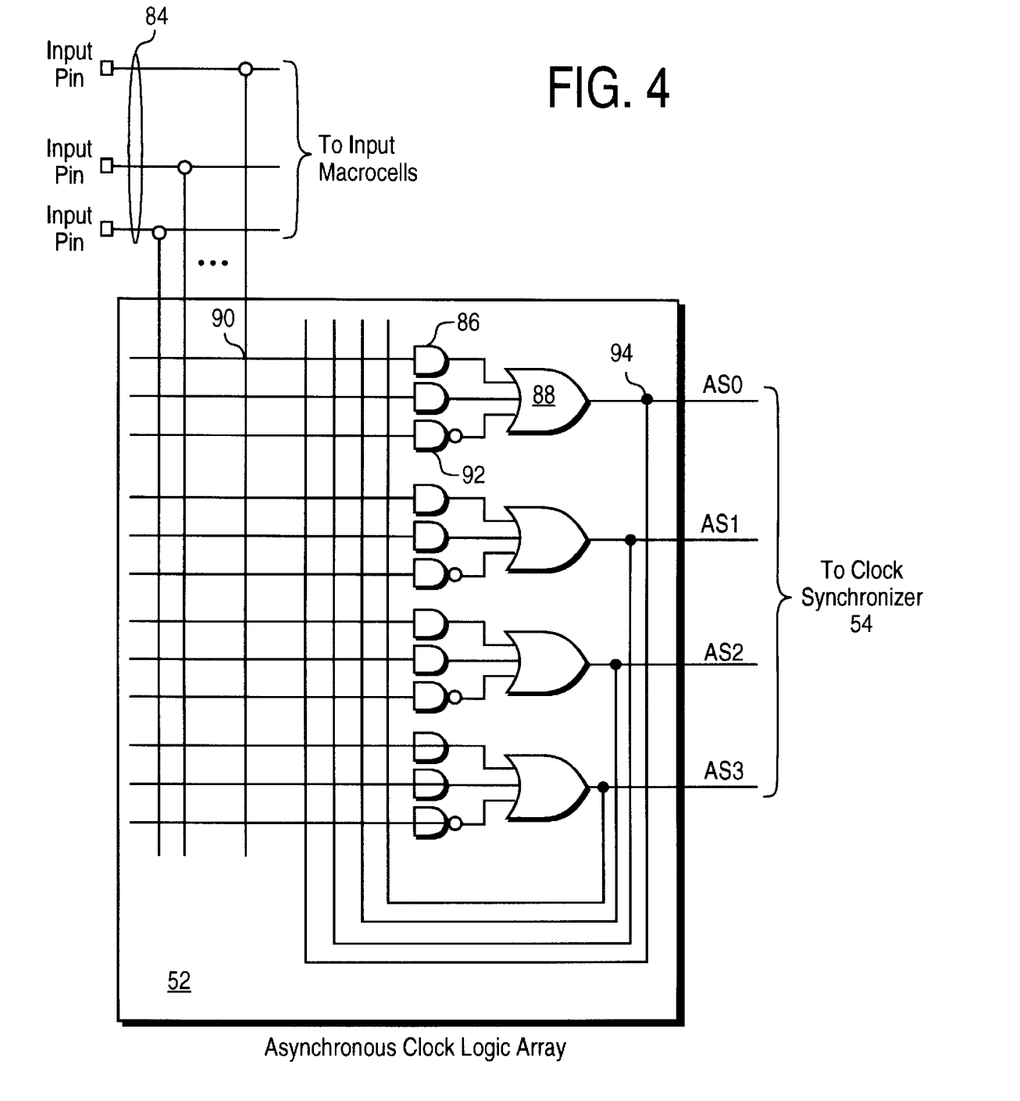
FIG. 4 illustrates one possible configuration of an asynchronous clock logic array for use according to one embodiment of the present invention.

FIG. 4 further illustrates CLA 52 in more detail. Again, the drawing shorthand discussed with reference to FIG. 1 is used here so as not to unnecessarily obscure the illustration. CLA 52 logically combines a subset (or all) of input signals 84 and/or their logic compliments using logic gates 86 and 88 to produce asynchronous logic derived clock signals AS0–AS3. Although CLA 52 is illustrated as being capable of providing four asynchronous logic derived clock signals, in other embodiments CLA 52 may be configured to provide fewer (e.g., 1–3, preferably 2–3) or more (e.g., $\geq 5$, preferably 5–64 or more preferably $2^n$ where $n \geq 3$ and preferably $3 \leq n \leq 6$) asynchronous logic derived clock signals.

The number of input signals 84 which are combined to produce any of asynchronous logic derived clock signals AS0–AS3 is user selectable. The interconnection nodes, such as node 90, within CLA 52 are programmable, for example through the use of antifuses, fuses, flash cells, EPROM cells, RAM cells (e.g., refer to co-pending application Ser. No. 08/805,890, filed Mar. 3, 1997, entitled "Self-Initialing RAM-Based Programmable Device") or other programmable elements. In this way, asynchronous logic derived clock signals AS0–AS3 produced by CLA 52 can be tailored to suit the required operation. CLA 52 may also provide a number of NAND terms 92. These NAND terms 92 allow for logical OR functions which those skilled in the art will recognize may be realized by DeMorganizing the logical complements of selected input signals 84. In this way, a "sum" term signal including more than three input terms may be provided without the need for a second pass through a logic array as was required for the apparatus illustrated in FIG. 1. Further, CLA 52 provides feedback paths, for example via node 94, which may allow product term (or sums of product term) signals to be combined with further sets or subsets of input signals 84 to produce even more logically complex asynchronous logic derived clock signals AS0–AS3.

Figure 5:
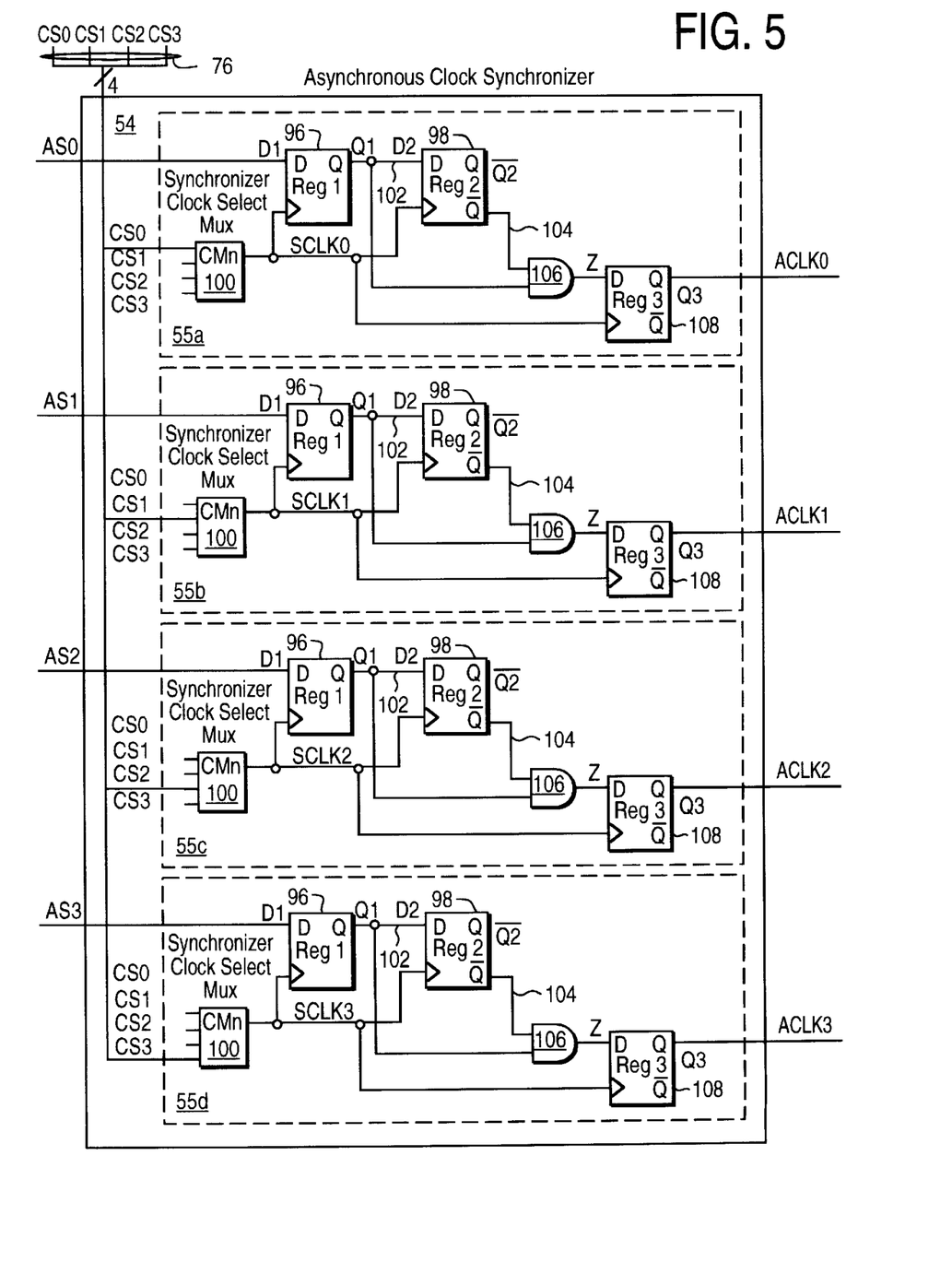
FIG. 5 illustrates one possible asynchronous logic derived clock signal synchronizer/clock pulse generator for use according to one embodiment of the present invention.

FIG. 5 further illustrates ACS 54. Asynchronous clock synchronizer (ACS) 54 receives as inputs, asynchronous logic derived clock signals AS0–AS3 and synchronizes one or more of these signals, each to a selected one of external synchronous clock signals 76 to produce synchronized logic derived clock signals ACLK0–ACLK3. Although illustrated as capable of accommodating four input asynchronous logic derived clock signals AS0–AS3, in other embodiments ACS 54 may accommodate more or fewer asynchronous logic derived clock inputs. Likewise, although the illustrated embodiment receives four external synchronous clock signals 76 (CS0–CS3), other embodiments may accommodate more or fewer such signals, depending upon the requirements of programmable device 50. Of course, ACS 54 may also be configured to provide more (e.g., $\geq 5$, preferably 5–64 or more preferably $2^n$, where $n \geq 3$ and preferably where $3 \leq n \leq 6$) or fewer (e.g., 1–3, preferably 2–3) synchronized logic derived clock signals than the illustrated ACLK0–ACLK3.

Asynchronous clock synchronizer 54 includes blocks 55a–55d, each of which includes synchronizing registers 96 and 98 and synchronous clock select multiplexers 100. For the illustrated embodiment, synchronizing registers 96 and 98 are D-type data registers, however, those skilled in the art will appreciate that other registers could be utilized with appropriate logic. Also included in each block 55a–55d are AND gates 106 and clock pulse registers 108. In operation, an asynchronous logic derived clock signal, e.g., AS0 for block 55a, is provided from CLA 52 to the input of a first synchronizing register 96. This asynchronous logic derived clock signal is captured in register 96 on the rising edge of a synchronous clock signal SCLK0 (provided by clock select mux 100), to produce a first intermediate signal on line 102. The first intermediate signal is itself captured in register 98 on the next rising edge of SCLK0 to provide a second intermediate signal on line 104. The second intermediate signal on line 104 is generated by the complemented (inverted) output of register 98 and is a signal which is the logic complement of the first intermediate signal captured in register 96 on the immediately previous synchronous clock cycle. The first and second intermediate signals are logically combined in AND gate 106 to produce a third intermediate signal which is captured in register 108 on a rising edge of SCLK0 to provide synchronized logic derived clock signal ACLK0. The other synchronized logic derived clock signals ACLK1–ACLK3 are similarly produced by synchronizing other asynchronous logic derived clock signals AS1–AS3, each to one of the synchronous clock signals (CS0–CS3) 76.

Multiplexers 100 provide means for selecting one of synchronous clock signals CS0–CS3, 76. An appropriate one of the synchronous clock signals 76 is selected using mux control signals to provide a delayed synchronous clock signal SCLK0–SCLK3. Note that because the propagation delay through multiplexer 100 is approximately the same as the propagation delay through input clock select mux 78 of input macrocell 60, the resulting delayed synchronous clock signal SCLK0–SCLK3 will be time shifted from a selected synchronous clock signal CS0–CS3 by approximately the same time as the clock signal presented to register 58 on input clock line 74. The external synchronous clock signal used to capture an input data signal in register 58 will typically be the same synchronous clock signal used by ACS 54 to synchronize one of the asynchronous logic derived clock signals AS0–AS3 to provide one of the synchronized logic derived clock signals ACLK0–ACLK3 for use by register 68 in output macrocell 66.

Figure 6:
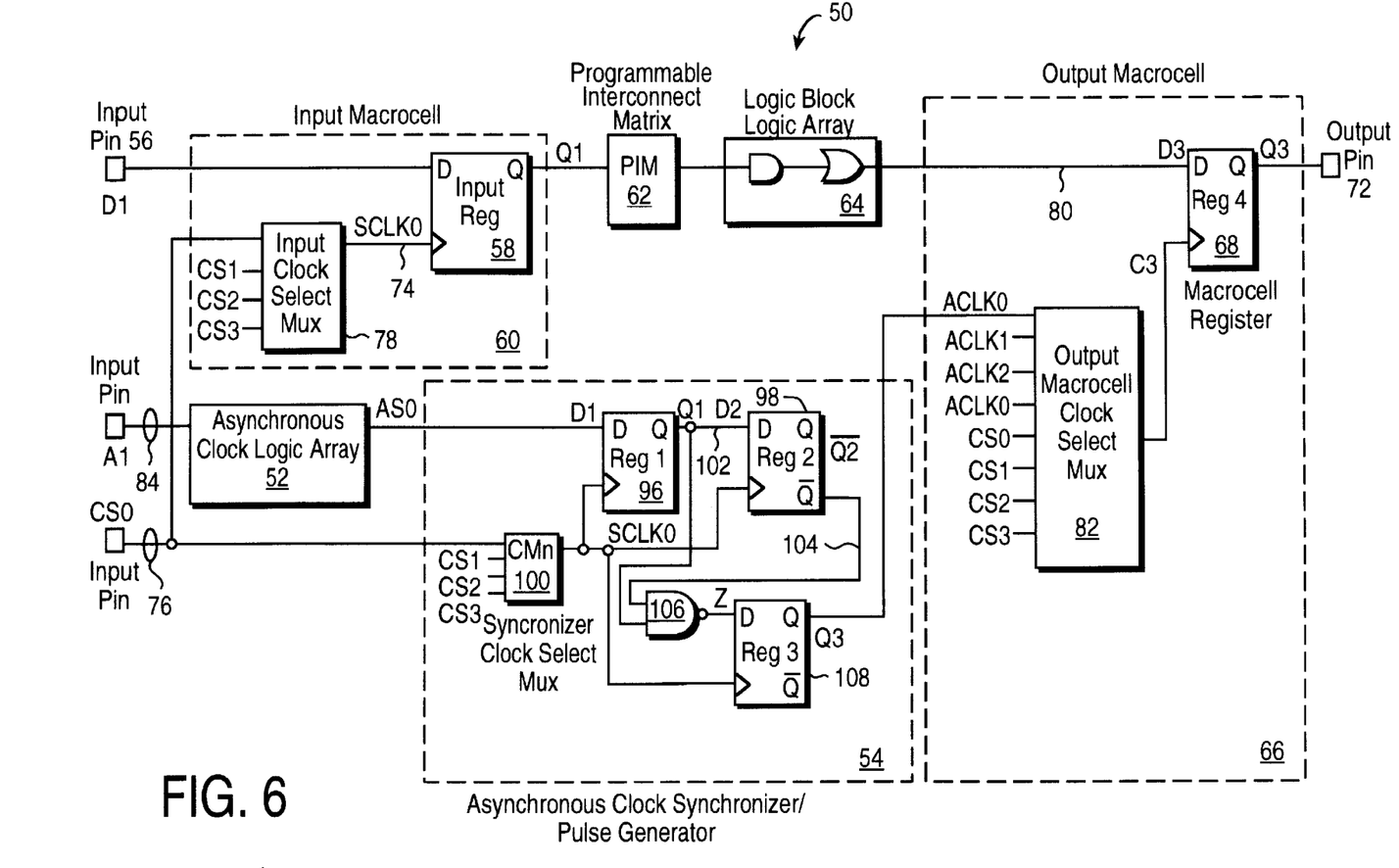
FIG. 6 illustrates signal paths for a data signal and a logic derived clock signal to an output macrocell register in a programmable device according to a further embodiment of the present invention.

The operation of programmable device 50 is more fully described with reference to the signal path diagram of FIG. 6 and the timing diagram of FIG. 7. FIG. 6 shows the signal paths for a data input signal DI applied to input pin 56 to be captured in register 58 and subsequently in register 68 by a synchronized logic derived clock signal C3 which is produced from an input logic signal AI. Although only a single input signal AI is illustrated, it should be recognized that signal AI may be a combination of a number of input signals 84 as illustrated in FIGS. 3 and 4. Synchronized logic derived clock signal C3 has a fixed duration logic HIGH interval regardless of the duration of the logic HIGH interval of signal AS0, which itself is produced from input logic signal(s) AI. The input signal DI is processed through programmable device 50, as described below, to produce a data signal D3 on line 80 to be captured in output register 68 in output macrocell 66. Data signal D3 is captured in output register 68 on the rising edge of clock signal C3 so it is important that clock signal C3 be provided at a time when data signal D3 is valid. The manner in which this synchronization of signals is achieved in programmable device 50 is discussed with reference to the timing diagram of FIG. 7.

Figure 7:
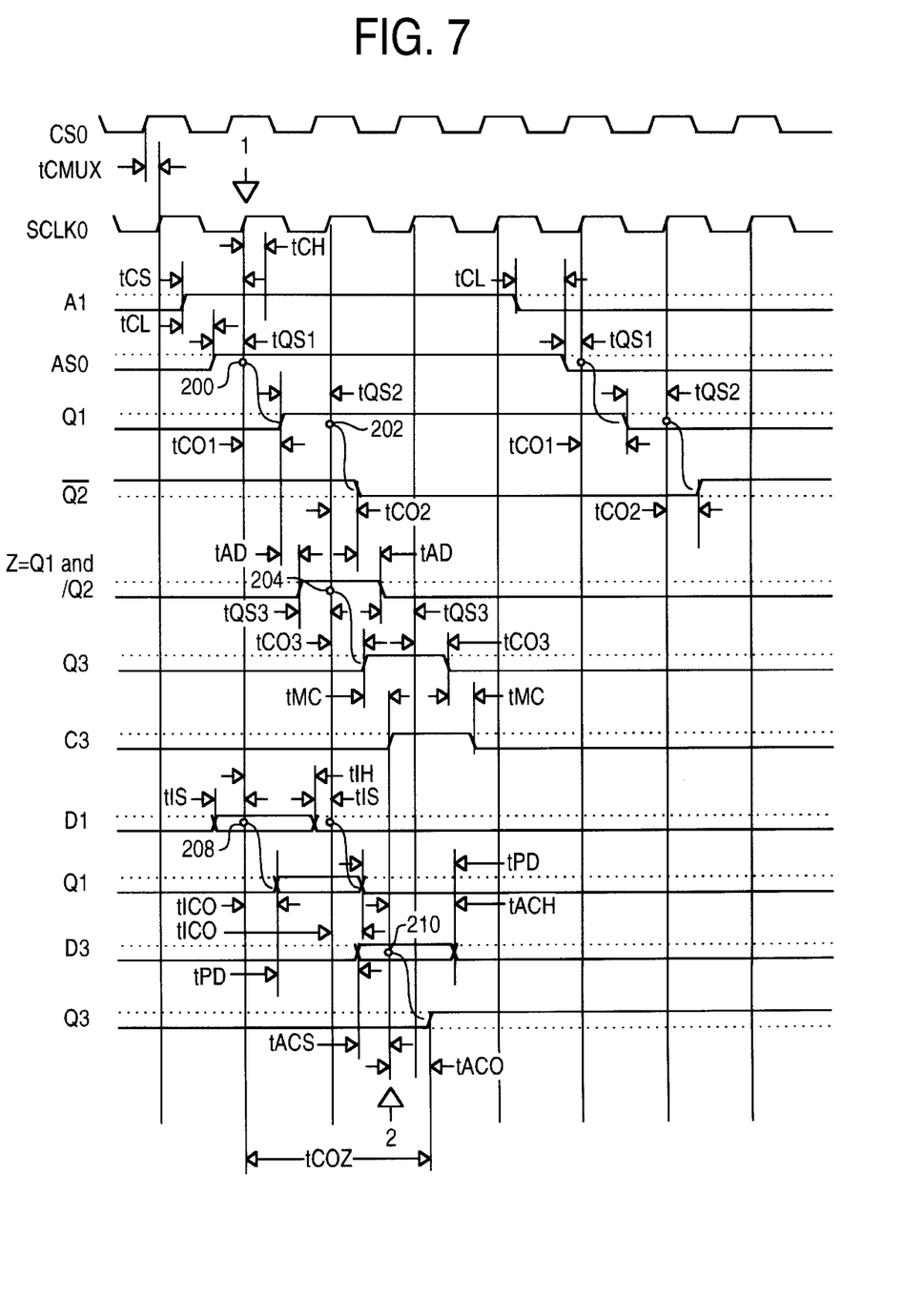
FIG. 7 is a timing diagram illustrating the operation of the embodiment shown in FIG. 6.

FIG. 7 shows the timing for the synchronizing of a logic derived clock signal which ensures the reliable capture of data in output register 68 regardless of the time of arrival of the external signal changes AI which control the logic derived clock signal. As will become apparent, data may be captured in register 68 on alternate clock cycles of an external synchronous clock signal at the data input, DI, with a logic derived clock signal which is created via an external input signal transition on inputs AI of CLA 52. The frequency at which data can be processed by the logic derived clock signal C3 is one half the frequency of the external synchronous clock signal CS0. In FIGS. 6 and 7, it is assumed that synchronous clock signal CS0 is used to capture data signal DI in input register 58 and is therefore also used to synchronize the asynchronous logic derived clock AS0 for use by output register 68. For this reason, only one synchronous clock input signal, CS0, and a single set of synchronizing registers 96 and 98 have been illustrated. However, it should be appreciated that this embodiment is merely one possible configuration of the programmable device 50 more explicitly illustrated in FIGS. 3–5 and is provided for purposes of explanation and not limitation.

The generation of the synchronized logic derived clock signal ACLK0 will be discussed first. One or more input logic signals AI are provided to CLA 52 which produces asynchronous logic derived clock signal AS0 as described above with reference to FIGS. 3 and 4. As shown in FIG. 7, asynchronous logic derived clock signal AS0 is delayed from input logic signal(s) AI by a time $t_{CL}$, a maximum possible propagation delay associated with CLA 52.

Asynchronous logic derived clock signal AS0 is provided as input signal D1 to a first synchronizing register 96 in ACS 54. Synchronizing register 96 captures signal D1 on the rising edge of delayed synchronous clock signal SCLK0 which is provided by synchronous clock select mux 100. As shown in FIG. 7, SCLK0 is a synchronous clock signal time delayed from input synchronous clock signal CS0 by a time $t_{CMUX}$, a propagation delay associated with mux 100. Asynchronous logic derived clock signal AS0 is captured on a rising edge of SCLK0, transition point 200 in FIG. 7, to produce intermediate signal Q1 at the output of the first synchronizing register 96. Note that Q1 is delayed from transition point 200 (corresponding to the time of a rising edge of SCLK0) by a propagation delay $t_{CO1}$, the maximum possible delay associated with register 96.

Intermediate signal Q1 is provided as an input signal D2 to a second synchronizing register 98. Synchronizing register 98 captures intermediate signal Q1 on the next rising edge of SCLK0, transition point 202 in FIG. 7. This produces intermediate signal $\overline{Q2}$, which is the logic complement of intermediate signal Q1 captured in register 98 at transition point 202. Intermediate signal $\overline{Q2}$ is delayed from transition point 202 by a propagation delay $t_{CO2}$ associated with register 98. Intermediate signal $\overline{Q2}$ is logically combined with intermediate signal Q1 in AND gate 106 to produce intermediate signal Z. Note that there is a propagation delay $t_{AD}$ associated with AND gate 106. Intermediate signal Z is captured in register 108 on the same rising edge of SCLK0 as intermediate signal Q1 is captured in register 98 (see transition point 204). This produces output signal Q3 which is the synchronized logic derived clock signal ACLK0 which is provided by ACS 54 to output clock select mux 82.

Notice in FIG. 7 that prior to input logic signal AI rising to a logic HIGH state, intermediate signal Q1 is assumed to be in a logic LOW state and intermediate signal $\overline{Q2}$ is assumed to be in a logic HIGH state. Then, when input logic signal AI rises to a logic HIGH, followed by asynchronous logic derived clock signal AS0 after propagation delay $t_{CL}$, the logic HIGH state is captured by register 96 on a rising edge of SCLK0 at transition point 200 (time 1). As a result, intermediate signal Q1 rises to a logic HIGH but intermediate signal $\overline{Q2}$ does not change state until the next rising edge of SCLK0 is recognized (plus the associated propagation delay $t_{CO2}$). Thus, for a period of time equal to approximately one clock cycle of SCLK0 less the propagation delay $t_{CO1}$ associated with register 96 and extended by $t_{CO2}$, the propagation delay associated with register 98, signals Q1 and $\overline{Q2}$ are both in a logic HIGH state and, hence, intermediate signal Z (the logical AND of Q1 and $\overline{Q2}$) transitions to a logic HIGH.

So long as intermediate signal Z remains HIGH until the next rising edge of SCLK0 following time 1, this state will be captured by register 108, thus producing a logic HIGH output signal Q3. The logic HIGH state of intermediate signal Z is captured on the same rising edge of SCLK0 at transition point 204 as the state of intermediate signal Q1 is captured in register 98 at transition point 202. This ensures that intermediate signal $\overline{Q2}$ cannot change state before the logic HIGH state of intermediate signal Z is captured by register 108.

As further shown in FIG. 7, the output signal Q3, and hence the synchronized logic derived clock signal C3 provided to register 68, is a pulse having a fixed duration logic HIGH interval for each rising edge of the asynchronous logic derived clock signal AS0 which is captured by the synchronizing registers 96 and 98, regardless of the duration of the logic HIGH interval of the input logic signal AI. This ensures that the synchronizing registers 96 and 98 are ready to detect the next rising edge of asynchronous logic derived clock signal AS0 as soon as possible.

The fixed pulse duration for output signal Q3 (and, hence, clock pulse C3) is achieved because of the transition of intermediate signal $\overline{Q2}$ at transition point 202 to a logic LOW. Notice that once the logic HIGH state of intermediate signal Q1 is captured by register 98 on the rising edge of SCLK0 following time 1 at transition point 202, intermediate signal $\overline{Q2}$ transitions to a logic LOW after a propagation delay time $t_{CO2}$. This, in turn, causes intermediate signal Z to fall to a logic LOW after a propagation delay $t_{AD}$ associated with AND gate 106. This logic LOW state is captured by register 108 on the next rising edge of SCLK0 (transition point 206), causing output signal Q3 (i.e., clock pulse C3) to fall to a logic LOW, thus defining the fixed duration of the logic HIGH interval of the synchronized logic derived clock signal ACLK0.

Output clock select mux 82 provides clock pulse C3 which is delayed from synchronized logic derived clock signal ACLK0 (i.e., output signal Q3) by a time $t_{MC}$, the maximum possible propagation delay associated with mux 82. In this way, a synchronized logic derived clock pulse having a fixed duration logic HIGH interval is provided to output register 68 to allow capture of a data signal on line 80.

The manner in which the data signal on line 80 (i.e., data signal D3) is produced is as follows. Data input signal DI on input pin 56 is captured by register 58 on a rising edge of synchronous clock signal SCLK0 on input clock line 74. Notice that synchronous clock signal SCLK0 is the synchronous clock signal CS0 time delayed by a time $t_{CMUX}$, a propagation delay associated with input clock select mux 78. This is the same SCLK0 that was used to synchronize logic derived clock signal AS0 as discussed above. Accordingly, input clock select mux 78 and synchronous clock select mux 100 are selected such that the two devices provide similar propagation delays. It will be recognized that this may be achieved in one embodiment by using a single synchronous clock select mux which provides a selected input synchronous clock signal SCLK0 to both input register 58 and ACS 54.

As shown in FIG. 7, data input signal DI is captured in input register 58 on the same rising edge of SCLK0 at time 1 as asynchronous logic derived clock signal AS0 is clocked in register 96 (see transition points 200 and 208). This produces output signal QI at the output of register 58 after an associated propagation delay through register 58 of time $t_{ICO}$. Output signal QI is routed through PIM 62 and combined with other signals in device 50 in logic block logic array 64 to produce data signal D3, delayed by a time $t_{PD}$, the propagation delay associated with PIM 62 and logic block logic array 64.

Notice that the relative timings of the signals in programmable device 50 are such that data signal D3 is valid at a time 210 which corresponds to the rising edge of logic derived clock pulse C3. As a result, valid data is captured in register 68 to produce output signal O3 after an associated propagation delay $t_{ACO}$. Notice further that even after input signal AI returns to a logic LOW, causing intermediate signals Q1 and $\overline{Q2}$ to change their respective logic states, intermediate signal Z is unaffected, remaining LOW because Q1 and $\overline{Q2}$ are not simultaneously HIGH. Hence, no spurious clock pulses C3 are produced. Thus, the synchronized logic derived clock pulse C3 is predictable in nature.

For the clock synchronizing scheme to work reliably the upper bound on the frequency of the synchronous clock, SCLK0, to which the logic derived clock, AS0, can be synchronized should be consistent with the timing restrictions set forth below. The definitions of the timing parameters used in the equations for the timing restrictions are as follows:

$t_{PA}$=the minimum possible clock period at which data can be processed by the logic derived clock signal C3 which is synchronized to the external synchronous clock signal, SCLK0.

$t_{PS}$=the minimum clock period of synchronous clock waveform SCLK0 which still achieves synchronization of the asynchronous logic derived clock input, e.g., AS0, to synchronous clock signal SCLK0.

$t_{WH}$=the minimum allowed logic HIGH time of synchronous clock waveform SCLK0 which still achieves synchronization of the asynchronous logic derived clock input, e.g., AS0, to synchronous clock signal SCLK0.

$t_{WL}$=the minimum allowed logic LOW time of synchronous clock waveform signal SCLK0 which still achieves synchronization of the asynchronous logic derived clock input, e.g., AS0, to synchronous clock signal SCLK0.

$t_{CL}$=the maximum possible propagation delay for an input signal AI to asynchronous clock logic array 52 to propagate through the CLA 52.

$t_{QS1}$=the minimum required input data setup time relative to the clock input, SCLK0, to guarantee capture of valid data in register 96.

$t_{CO1}$=the maximum possible delay from synchronous clock input, SCLK0, to valid output Q1 for register 96.

$t_{QS2}$=the minimum required input data setup time relative to the synchronous clock input, SCLK0, necessary to guarantee capture of valid data in register 98.

$t_{CO2}$=the maximum possible delay from synchronous clock input, SCLK0, to valid output Q2 for register 98.

$t_{QS3}$=the minimum required input data setup time relative to the synchronous clock input to guarantee capture of valid data in register 108.

$t_{CO3}$=the maximum possible delay from synchronous clock input, SCLK0, to valid output for register 108.

$t_{MC}$=the maximum possible propagation delay for the synchronized logic derived clock signal ACLK0 to propagate through the output macrocell clock selection mux 82 to the clock input of the output register 68.

$t_{PD}$=the maximum possible propagation delay for the signal QI in FIG. 6 to propagate through the programmable interconnect matrix 62 and logic block logic array 64 to the data input of the output register 68.

$t_{CS}$=the minimum required logic signal (e.g., signal AI) setup time at the input of CLA 52 relative to the synchronous clock signal input, SCLK0, for register 96 to guarantee transit of the CLA 52 and adequate time to meet setup time $t_{QS1}$ at the data input of register 96 to guarantee capture of the desired logic derived clock state in register 96.

$t_{CH}$=the minimum required logic derived (e.g., signal AI) hold time at the input of CLA 52 relative to the synchronous clock signal input, SCLK0, for register 96 considering transit of the CLA 52 and adequate to meet input data hold time at the data input of register 96 to guarantee capture of the desired logic derived clock state in register 96.

$t_{IS}$=the minimum required input data signal setup time relative to the synchronous clock input, SCLK0, to guarantee capture of valid data DI at the data input of the input register 58.

$t_{IH}$=the minimum required input data signal hold time relative to the synchronous clock input, SCLK0, to guarantee capture of valid data DI at the data input of the input register 58.

$t_{ICO}$=the maximum possible delay from synchronous clock input, SCLK0, to valid output for the input register 58.

$t_{ACS}$=the minimum required input data signal setup time relative to the synchronized logic derived clock signal input at output register 68 to guarantee capture of valid data D3 at the data input of the output register 68.

$t_{ACH}$=the minimum required input data signal hold time relative to the synchronized logic derived clock signal input C3 at output register 68 to guarantee capture of valid data D3 at the data input of the output register 68.

$t_{ACO}$=the maximum possible delay from the synchronized logic derived clock signal input C3 at output register 68 to valid output data O3 for the output register 68.

$t_{AD}$=the input to output propagation delay for AND gate 106.

Timing constraints to guarantee synchronization of asynchronous logic derived clock signal AS0 with synchronous clock signal SCLK0 are determined in accordance with the following equations.

$$t_{PS} > \text{or} = t_{CL} + t_{QS1} \qquad 1.$$

$$t_{PS} > \text{or} = t_{CH} + t_{CL} + t_{QS1} \qquad 2.$$

$$t_{PS} > \text{or} = t_{CO1} + t_{QS2} \qquad 3.$$

$$t_{PS} > \text{or} = t_{IS} + t_{IH} \qquad 4.$$

$$t_{PS} > \text{or} = t_{CO1} + t_{AD} + t_{QS3} \qquad 5.$$

$$t_{PS} > \text{or} = t_{CO2} + t_{AD} + t_{QS3} \qquad 6.$$

$$t_{PS} + t_{CO3} + t_{MC} > \text{or} = t_{ICO} + t_{PD} + t_{ACS} \qquad 7.$$

$$t_{PA} > \text{or} = 2(t_{PS}) 8.$$

The minimum possible clock period for synchronous clock signal SCLK0 is determined by the largest required $t_{PS}$ determined by constraints 1 through 7 above. The minimum period between data captures by the synchronized logic derived clock ACLK0 is determined by constraint 8 above.

For input data DI which is applied to input register 58 early enough to satisfy the $t_{IS}$ setup time relative to a rising edge of synchronous clock signal SCLK0 at time 1 (transition point 208 in FIG. 7), the resultant data signal D3 will be captured in the output register 68 by the rising edge of synchronized logic derived clock signal C3 at time 2 (transition point 210 in FIG. 7) if the asynchronous logic derived clock signal source signal(s) AI has (have) been applied to the input of asynchronous clock logic array 52 a setup time $t_{CS}$ before the rising edge of synchronous clock signal SCLK0 at time 1 (transition point 200 in FIG. 7). Setup time $t_{CS}$ for asynchronous input signal(s) AI allow(s) for CLA 52 transit time $t_{CL}$ and for register 96 setup time $t_{QS1}$, allowing the resulting asynchronous logic derived clock signal AS0 to be captured in the first synchronizing register 96. The subsequent synchronizing register 98 allows for metastability events which may result from violation of setup and hold times due to unpredictable arrival of the asynchronous clock logic array 52 input signal(s) AI. Data D3 to be captured in the output register 68 by the synchronized logic derived clock signal C3 can be captured in the input register 58 on every other rising edge of the of the synchronous clock signal SCLK0, providing an asynchronous data rate of one half the synchronous clock frequency $1/t_{PS}$ (maximum asynchronous data rate is $\frac{1}{2}t_{PS}$).

If one wishes to ensure capture of input data DI in output register 68 by asynchronous input signal AI, the input data DI can be held at the input for two consecutive synchronous clock rising edges (SCLK0) to insure against the asynchronous input signal (AI) failing to be captured on the first rising edge of SCLK0 at time 1 (transition point 200 in FIG. 7).

Thus, a means for providing a fast logic generated clock pulse of fixed duration for use in programmable devices to allow higher performance logic derived clocking frequencies and for synchronizing logic derived clock signals to a synchronous data clock to eliminate the risks of register data and clock timing mismatch has been described. Although discussed with reference to specific illustrated embodiments, it should be appreciated that the present invention is applicable to wide numbers of programmable devices, including PLDs, CPLDs, FPGAs, and ASICs. In addition, it should be recognized that the polarity of signal AI could be reversed (with the addition of suitable logic) so that the asynchronous logic derived clock signal would be responsive to a negative going pulse (i.e., a falling edge). Accordingly, the above discussed embodiments and accompanying diagrams should be regarded as illustrative only and the present invention should in no way be limited thereby.

What is claimed is:

1. A circuit comprising means for generating an asynchronous logic derived clock signal from one or more of a plurality of input signals; and means for synchronizing said asynchronous logic derived clock signal to a reference clock signal to generate a synchronized logic derived clock signal coupled to said means for generating, said synchronized logic derived clock signal having a fixed duration logic HIGH interval regardless of the duration of logic HIGH intervals of said one or more input signals, wherein said means for synchronizing comprises a series coupled register pair configured to receive said asynchronous logic derived clock signal as an input and to generate intermediate and output signals in response to clock inputs of said reference clock signal.

2. A circuit as in claim 1 wherein said series coupled register pair comprises two D-type data registers.

3. A circuit as in claim 1 wherein said means for synchronizing further comprises a synchronous clock select multiplexer coupled to receive a plurality of external synchronous clock signals and to provide one of said plurality of synchronous clock signals as said reference clock signal to said series coupled register pair.

4. A circuit as in claim 3 wherein said means for synchronizing further comprises a clock pulse register coupled to receive an input signal which is a logical combination of said intermediate and output signals of said series coupled register pair and to receive said reference clock signal and to provide an output signal in response thereto, said output signal being said synchronized logic derived clock signal.

5. A circuit as in claim 4 wherein said clock pulse register receives said input signal which is a logical AND of said intermediate and output signals of said series coupled register pair.

6. A method of generating a synchronized logic derived clock signal in a programmable device comprising the steps of:

generating an asynchronous logic derived clock signal from one or more of a plurality of input signals; and synchronizing said asynchronous logic derived clock signal to a reference clock signal to produce a synchronized logic derived clock signal having a fixed duration logic HIGH interval regardless of the duration logic HIGH intervals of said one or more input signals, said step of synchronizing further includes the steps of:

capturing said asynchronous logic derived clock signal in a first register on a first clock pulse of said reference clock signal to produce a first intermediate signal;

capturing said first intermediate signal in a second register on a subsequent clock pulse of said reference clock signal to produce a second intermediate signal; and capturing a third intermediate signal in a third register on said subsequent clock pulse of said reference clock signal to produce said synchronized logic derived clock signal, said third intermediate signal being a logical combination of said first intermediate signal and said second intermediate signal.

7. A method as in claim 6 wherein said logical combination of said first intermediate signal and said second intermediate signal is a logical AND.

8. A method of synchronizing an asynchronous logic derived clock signal with a data signal in a programmable device comprising the steps of:

capturing an input signal in said programmable device in response to a first clock pulse of a synchronous clock signal so as to produce said data signal; and synchronizing said asynchronous logic derived clock signal with said synchronous clock signal to produce a synchronized logic derived clock signal having a fixed duration logic HIGH interval regardless of the duration of logic HIGH intervals of said asynchronous logic derived clock signal, and capturing said data signal in a register of said programmable device in response to said synchronized logic derived clock signal, wherein said step of synchronizing further includes the steps of:

capturing said asynchronous logic derived clock signal in a first synchronizing register in response to said first clock pulse of said synchronous clock signal to produce a first intermediate signal;

capturing said first intermediate signal in a second synchronizing register in response to a second clock pulse of said synchronous clock signal following said first clock pulse to produce a second intermediate signal;

capturing a logical combination of said first intermediate signal and said second intermediate signal in a clock pulse register in response to said second clock pulse of said synchronous clock signal to produce said synchronized logic derived clock signal.

9. A method as in claim 8 wherein said asynchronous logic derived clock signal is produced from one or more asynchronous input signals to said programmable device.

10. A method as in claim 9 wherein said asynchronous logic derived clock signal is one of a sum term, a sum of products term, a product term or a logical NAND term of said asynchronous input signals.

11. A method as in claim 10 wherein said logical combination of said first and second intermediate signals is a logical AND.

12. A device for synchronizing an asynchronous logic derived clock signal with a data signal in a programmable device comprising:

means for capturing an input signal in said programmable device in response to a first clock pulse of a synchronous clock signal so as to produce said data signal;

means for synchronizing said asynchronous logic derived clock signal with said synchronous clock signal to produce a synchronized logic derived clock signal having a fixed duration logic HIGH interval regardless of the duration of the logic HIGH intervals of said asynchronous logic derived clock signal; and     means for capturing said data signal in a register of said programmable device in response to said synchronized logic derived clock signal.

13. A device as in claim 12 wherein said means for synchronizing comprises:

means for capturing said asynchronous logic derived clock signal in a first synchronizing register in response to said first clock pulse of said synchronous clock signal to produce a first intermediate signal;

means for capturing said first intermediate signal in a second synchronizing register in response to a second clock pulse of said synchronous clock signal following said first clock pulse to produce a second intermediate signal;

means for capturing a logical combination of said first intermediate signal and said second intermediate signal in a clock pulse register in response to said second clock pulse of said synchronous clock signal to produce said synchronized logic derived clock signal.

14. A device as in claim 13 wherein said asynchronous logic derived clock signal is produced from one or more asynchronous input signals to said programmable device.

15. A device as in claim 14 wherein said asynchronous logic derived clock signal is one of a sum term, a sum of products term, a product term or a logical NAND term of said asynchronous input signals.

16. A device as in claim 15 wherein said logical combination of said first and second intermediate signals is a logical AND.

\* \* \* \* \*